United States Patent [19]
Araki et al.

[11] Patent Number: 5,882,994
[45] Date of Patent: Mar. 16, 1999

[54] NONVOLATILE SEMICONDUCTOR MEMORY, AND METHOD OF MANUFACTURING THE SAME

[75] Inventors: Yoshiko Araki, Kanagawa-ken; Seiichi Mori, Tokyo, both of Japan

[73] Assignee: Kabushiki Kaisha Toshiba, Kawasaki, Japan

[21] Appl. No.: 720,729

[22] Filed: Oct. 1, 1996

[30] Foreign Application Priority Data

Oct. 2, 1995 [JP] Japan .................................. 7-254784

[51] Int. Cl.[6] .............................................. H01L 21/8247
[52] U.S. Cl. ............................................ 438/593; 438/592
[58] Field of Search ............................. 437/43, 52, 191, 437/193; 438/592, 593, 594

[56] References Cited

U.S. PATENT DOCUMENTS

| | | | |
|---|---|---|---|
| 4,249,968 | 2/1981 | Gardiner et al. | |
| 5,147,813 | 9/1992 | Woo | 437/43 |
| 5,256,894 | 10/1993 | Shino | 257/388 |
| 5,289,026 | 2/1994 | Ong | 257/316 |
| 5,439,838 | 8/1995 | Yang | 437/43 |
| 5,445,982 | 8/1995 | Hwang | 437/43 |

OTHER PUBLICATIONS

Wolf et al., "Silicon Processing for the VLSI Era Volume 1: Process Technology", Lattice Press, pp. 164–169 1986.

*Primary Examiner*—Richard A. Booth
*Attorney, Agent, or Firm*—Finnegan, Henderson, Farabow, Garrett & Dunner, L.L.P.

[57] ABSTRACT

A method of manufacturing the semiconductor memory comprises a plurality of steps. The steps include forming a first oxide film on a semiconductor substrate, forming a polysilicon electrode on the first oxide film by the sub-steps of forming a low impurity density polysilicon layer, forming a high impurity density polysilicon layer, and forming a low impurity density polysilicon layer in this order, and forming a second oxide film on the polysilicon electrode.

19 Claims, 3 Drawing Sheets

NONVOLATILE SEMICONDUCTOR MEMORY, AND METHOD OF MANUFACTURING THE SAME

BACKGROUND OF THE INVENTION

1. Field Related to the Invention

The present invention concerns a method for manufacturing a semiconductor, and in particular a method for manufacturing a two-layered structure of a nonvolatile semiconductor memory.

2. Description of the Related Art

In the memory cell array of a nonvolatile semiconductor memory, there is a structure which contains a two-layered gate structure comprising a floating gate, which is electrically insulated from the periphery, in addition to a control gate of a usual gate.

The structure of the nonvolatile memory, which includes the conventional two-layered structure, is described in FIG. 1.

Cell gate oxide film 83 (about 100 angstrom thick) is formed on the surface within the region enclosed by field oxide film 82, which is formed on semiconductor substrate 81. Floating gate 84 (about 1000 angstrom to 2000 angstrom thick) is formed on cell gate oxide film 83. An ONO (oxide/nitride/oxide) insulation film 85 containing a three layer structure, such as a silicone oxide film/silicone nitride layer/silicone oxide layer or 50–60 angstrom/60 angstrom/50–60 angstrom, respectively, is formed on floating gate 84. A control gate 86 of polysilicon WSi 2000 angstrom/1200 angstrom is then formed on insulation film 85, which forms a MOS transistor.

When electrons are involved in floating gate 84, the channel cannot be easily induced by the negative charge of electrons, even if a word line attains a high voltage, because the threshold voltage rises too high to turn on the transistor. When electrons are not involved in floating gate 84, however, a high voltage applied to control gate 86 turns on the transistor if the word line attains a high voltage.

On the other hand, electrons can be accumulated in floating gate 84 by regulating the voltage applied to control gate 86 and a drain region (not depicted in the Figures). Floating gate 84 is formed by diffusing an N-type impurity, for instance, phosphorus, to attain a uniform density after deposition of polysilicon.

A bottom oxide film, corresponding to a silicon oxide film of the lowest layer for ONO insulating film 85, is formed by oxidizing polysilicon by thermal oxidation, where the impurity pertaining to floating gate 84 is diffused. This oxidation should proceed at a high temperature of about 850°–1000° C. in order to obtain sufficient insulation characteristics and charge storage characteristics. This process uses ONO insulating film 85 in three layers, which have, for instance, enhanced charge storage characteristics, rather than formation with the single silicon oxide film layer only.

However, when the memory cell is formed using the above-mentioned method, phosphorus within floating gate 84 is diffused into the cell gate oxide film through the route shown by arrow 1 in FIG. 1 in the course of the oxidation process for the bottom oxide film, which results in structural damage within the cell gate oxide film. Moreover, it invokes a problem concerning reliability due to an increase in the leak current.

Furthermore, because floating gate 84 is formed through the route indicated by arrow 2 in FIG. 1, phosphorus in polysilicon is diffused into the bottom oxide film during oxidation of polysilicon, which results in the degradation of the bottom oxide film quality.

Also, the oxidation rate for polysilicon containing abundant phosphorus is quickened by an accelerating phenomena, which causes a problem in the film thickness controllability. This controllability problem makes it difficult to form the oxide film with a desired thin film thickness.

In the preprocess used in forming the bottom oxide film, a polysilicon surface containing phosphorus is flooded with some liquid during a chemical process, e.g. wafer cleaning process, or exposed to an atmosphere, which brings up oxidation. As a result, rough natural oxide film is formed. In such a thick region, where the bottom oxide film thickness exceeds 10 nm, the influence of the above-mentioned natural oxide film can be ignored. However, when the bottom oxidation film thickness must be minimized to less than 10 nm, corresponding to a micronization of devices, a poor quality natural oxidation film, 2 to 3 nm thick, cannot be ignored. Thus, countermeasures must be taken.

The natural oxide film is formed before the oxide film deposition, even with the LP-CVD (Low Pressure-Chemical Vapor Deposition) chamber being about 700° C. The temperature of 700° C. is the usual temperature when the bottom oxide film is formed by the LP-CVD method.

These natural oxide films change the film quality and the film thickness according to exposure time and process conditions of the wafer, which deteriorates the film thickness and the film quality control of the bottom oxide film.

In addition, the natural oxide film does not have a proper film quality, which results in the degradation of the bottom oxide film quality. This degradation often results in an insulation resistance, etc.

As mentioned above, a problem in the conventional semiconductor memory is the degradation in the cell gate oxide film quality due to the effects of phosphorus in the floating gate, which results in less reliability. Another problem is the lack of controllability in forming the bottom oxide film makes it difficult to achieve excellent film quality having a desired thin film thickness.

SUMMARY OF THE INVENTION

It is an object of the present invention to prevent any damage to the cell gate oxide film, and to provide a method for manufacturing a nonvolatile semiconductor memory to form a bottom oxide film which has excellent film quality.

DESCRIPTION OF THE DRAWINGS

A more complete appreciation of the present invention and many of its attendant advantages will be readily obtained by reference to the following detailed description[s], considered in connection with the accompanying drawings, in which.

DETAILED DESCRIPTION OF THE PREFERRED EMBODIMENTS

Embodiments of the present invention will be described in details with reference to the drawings.

FIGS. 2–8 are sectional views showing the nonvolatile semiconductor memory and the manufacturing process thereof for an embodiment of this invention.

Figure 1:
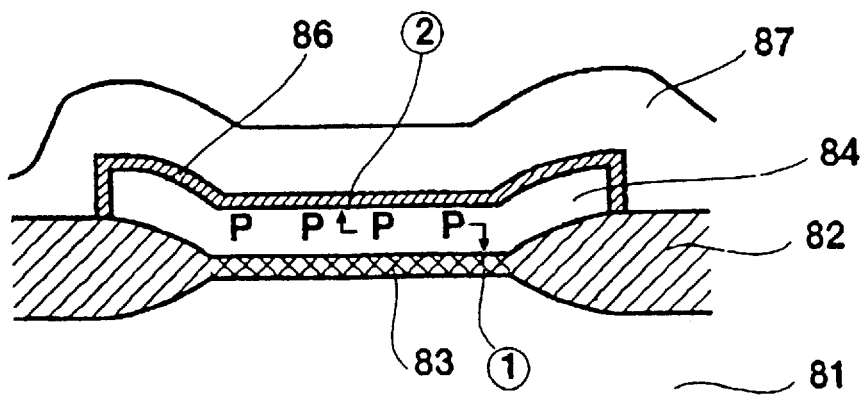
FIG. 1 is a sectional view showing a conventional example.
Figure 2:
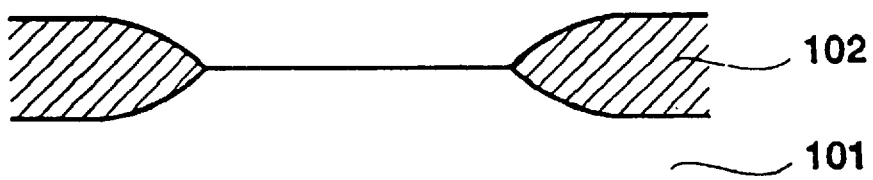
FIG. 2 is a sectional view showing a manufacturing process used in applying this invention.
Figure 3:
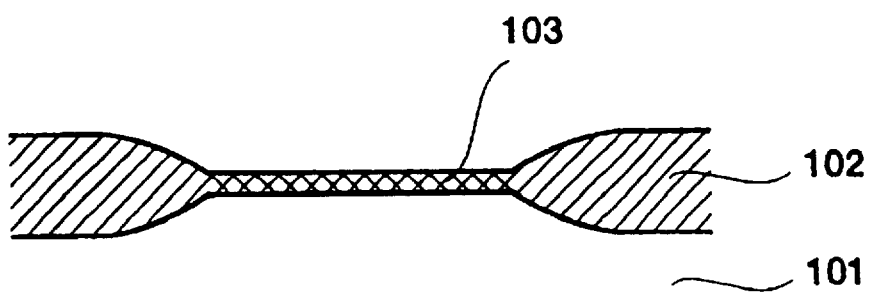
FIG. 3 is a sectional view showing a manufacturing process used in applying this invention.

In the first step, field oxide film 102 is formed on a fixed region of a surface of a P-type silicon substrate 101, using a selective oxidation, e.g. LOCOS (local oxidation) for the element isolation, as shown in FIG. 2. Then, a cell gate oxide film 103, 10 nm thick, is formed on an element region on the surface of the P-type silicon substrate 101, as shown in FIG. 3.

Figure 4:
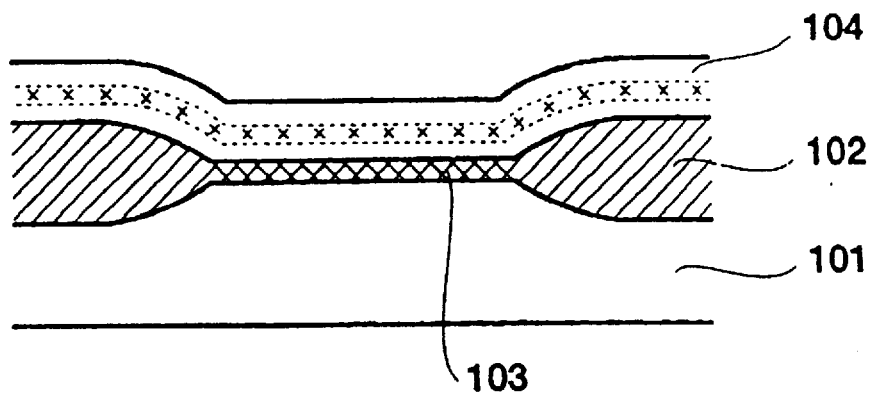
FIG. 4 is a sectional view showing a manufacturing process used in applying this invention.

Next, the first polysilicon layer 104 is formed on a cell gate oxide film 103 by an LP-CVD method, as shown in FIG. 4. This first polysilicon layer 104 is formed so as to configure a three-layered structure, such as non-doped polysilicon/impurity doped polysilicon/non-doped polysilicon while changing the deposition condition.

At this step, thickness and impurity density for each polysilicon film of the three layers is set so that the cubic density can exceed $3 \times 10^{19}$ cm$^{-3}$ in a situation where the impurity is uniformly diffused in the thermal process thereafter. In other words, when a 70 nm non-doped polysilicon layer/70 nm polysilicon layer containing phosphorus in a $1 \times 10^{20}$ cm$^{-3}$ density/70 nm non-doped polysilicon layer are used as the first polysilicon layer 104, the phosphorus density in the polysilicon layer attains $3 \times 10^{19}$ cm$^{-3}$, when the impurity is diffused uniformly. However, it is not desirable that the comparative impurity density in the polysilicon layers be so low as to ignore a potential fall in polysilicon.

Figure 5:
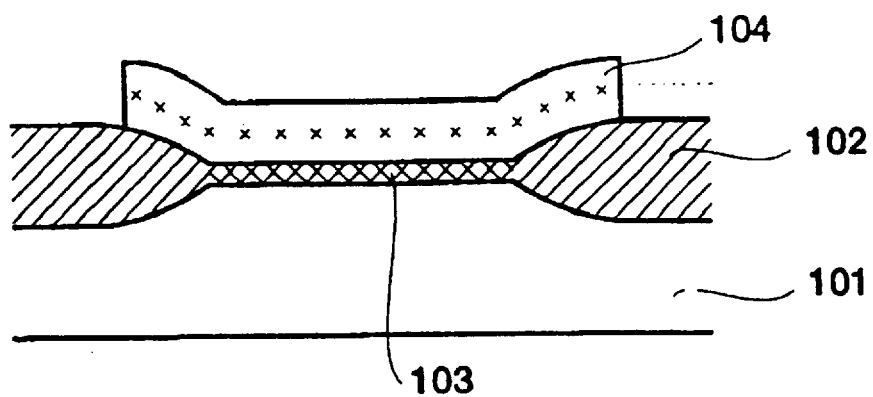
FIG. 5 is a sectional view showing a manufacturing process used in applying this invention.

A selective etching is performed for first polysilicon layer 104 on the field oxide film 102 using photoresist (not depicted in the figure) as a mask formed on the first polysilicon layer 104 as shown in FIG. 5. In this process, the length is defined in one direction of a floating gate in the two layered gate structure. After that, the photoresist (not depicted in the figure) is removed.

Subsequently, thermal oxidation is provided for the first polysilicon layer 104, as shown in FIG. 5, to form bottom oxide film 105. At this time, since the surface of the first polysilicon layer 104 is a non-doped polysilicon, which does not contain any impurity as mentioned above, the formation of the oxide film can be controlled in the oxidation preprocess, such as the cleaning process or the transfer process to the oxidation chamber.

On the other hand, to improve the oxide film quality, it is generally preferable to process the polysilicon oxidation at a high temperature. However, the impurity diffuses by heat in the oxidation process, causing the impurity to diffuse into the bottom oxide film. Moreover, the diffusion of the impurity may damage the cell gate oxide film, resulting in deterioration of the film quality. In order to avoid these problems as much as possible and to form good oxide film quality, it is recommended to employ the following method.

In a first method, the oxidation is performed at a high-velocity in a short period of time at about e.g. 1000° C., using a rapid thermal anneal (RTA) equipment. This method can be used to form a bottom oxide film, excellent in film quality, thus shortening the anneal time.

Next, the same effect as that achieved by the above-mentioned method can be accomplished while employing a usual oxidation chamber by oxidizing the wafer at the low temperature of 700° C. during processing with a temperature rise and temperature fall at a high-velocity, for example, approximately 50° to 100° C./minute.

Moreover, in the case of the low temperature oxidation, the polysilicon surface at the lower temperature, in general, appears as a more even surface, where it is easy for the impurity (phosphorus) to deposit on the grain boundary of the polysilicon crystal. This deposition impurity (phosphorus) is infused in the bottom oxide film, which causes film quality degradation. However, since the impurity density in the oxidized polysilicon surface is originally low and the grown oxidation film thickness is a maximum of only 10 nm, the structure of this invention can prevent uneven formation. Therefore, it is possible to control degradation of the bottom oxide film quality compared with conventional cases, even with the oxidation at low temperatures of 700° C. to 800° C.

Even with the oxidation at a high temperatures of 1000° C. to 1100° C., it is possible to obtain excellent oxidation film quality according to the structure of this invention as compared with the oxidation of polysilicon having a conventional, uniform impurity density.

It is recommended to deposit and form the silicon oxide film for the formation of the bottom oxide film by using the LP-CVD (Low Pressure-Chemical Vapor Deposition) method, which can form the bottom oxide film at a low temperature and avoid thermal oxidation. According to the LP-CVD method, the silicon oxide film can be deposited at 700° C.–800° C. Therefore, the structure of this invention can effectively decrease the damage caused by the impurity (phosphorus), especially in the case of the cell gate oxide film. In some cases during deposition in a conventional LP-CVD chamber, where a wafer is inserted in the chamber at 700° C. to 800° C., natural oxide film is formed. This results in low controllability of deposition oxide film thickness and causes deterioration in the entire film quality. However, the structure of this invention can control the formation of the natural oxide film, because the impurity density in the oxidized polysilicon layer surface is low.

Whether using oxidation or deposition in the structure of this invention, as mentioned above, an excellent bottom oxide film can be obtained, because the uppermost layer of the polysilicon does not contain phosphorus. Because the lowest layer of the polysilicon layer touching the cell gate oxide film does not contain phosphorous, it is easy to avoid damage to the cell gate oxide film in the oxidation process.

Figure 6:
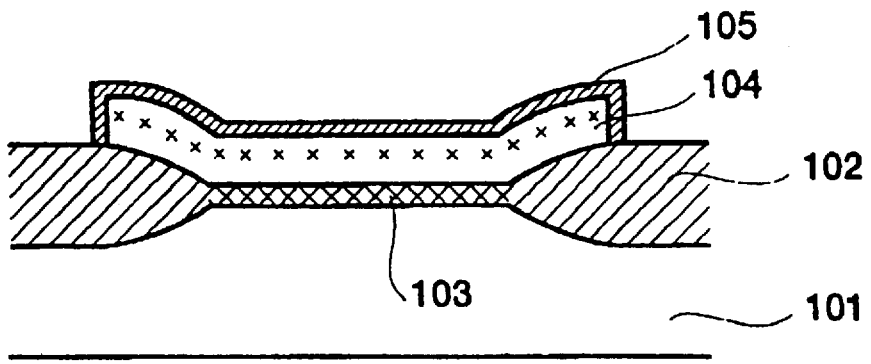
FIG. 6 is a sectional view showing a manufacturing process used in applying this invention.
Figure 7:
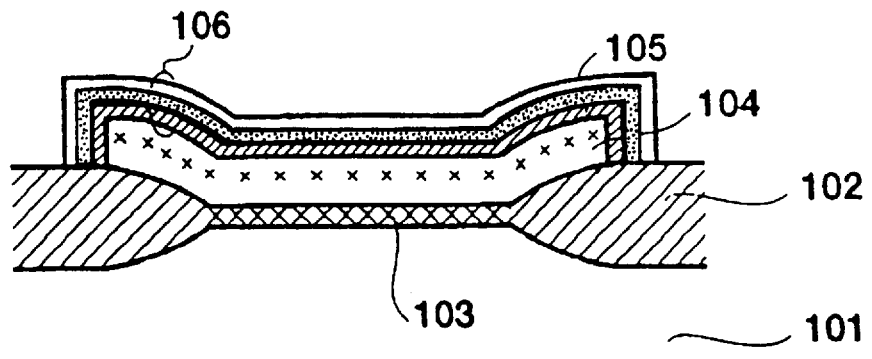
FIG. 7 is a sectional view showing a manufacturing process used in applying this invention.

As shown FIG. 6, a nitride film, 15 nm thick, is deposited on the bottom oxide film 105 using the LP-CVD method. ONO oxide film 106 is formed on the bottom oxide film 105 with a burning oxidation at 950° C. for this nitride film as shown in FIG. 7.

Figure 8:
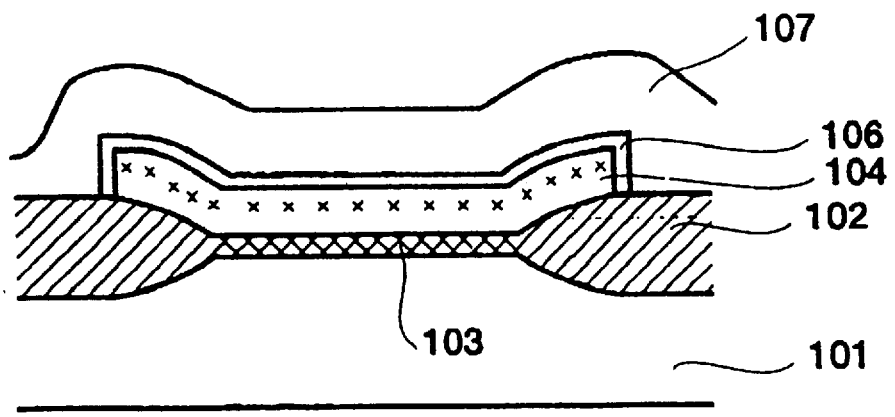
FIG. 8 is a sectional view showing a manufacturing process used in applying this invention.

Next, the second polysilicon layer 107 is deposited, as shown in FIG. 8. Then, the photoresist (not depicted in the Figure) is formed. This resist is used as a mask. Second polysilicon layer 107, ONO oxide film 105, first polysilicon layer 104, cell gate oxide film 103 are etched in order, while the control gate is formed using the second polysilicon layer 107, and the floating gate is formed by first polysilicon layer 104. Consequently, to form an N-type diffused layer, which becomes a source/drain, an impurity, e.g. arsenic, is implanted in the surface of the silicon substrate 101. Simultaneously, an ion implantation defect may occur. The ion implantation defect is corrected by implanting arsenic.

Then, an oxide film is formed on the periphery of the cell through post oxidation to cover the surroundings of the floating gate. Subsequently, an interlayer insulating layer is formed on the oxide film, and aluminum is deposited on the interlayer insulating layer as an Al wiring layer.

In this embodiment, the deposition conditions change during the deposition of the polysilicon, so as to change the impurity density of polysilicon layer 104, but is not limited to this method. It is preferable to implement the impurity under the condition of the acceleration voltage, e.g. 30 to 40 KeV, so that the impurity is implemented into the center of the thickness of the polysilicon layer using ion implantation after deposition of the polysilicon layer, which does not contain any impurity.

In this embodiment, the distribution of impurity density in polysilicon is divided into three layers of non-doped polysilicon layer/polysilicon layer containing phosphorus of about $1\times10^{20}$ cm$^{-3}$/non-doped polysilicon layer. There is no problem if the impurity density of the layers at both upper and lower sides is low, even if the inner layer forms a mufti layer. For example, the structure may be configured in such layers as non-doped polysilicon layer/polysilicon layer containing phosphorus of about $1\times10^{20}$ cm$^{-3}$/non-doped polysilicon layer/polysilicon layer containing phosphorus of about $1\times10^{20}$ cm$^{-3}$/non-doped polysilicon layer.

The floating gate structure of this embodiment considers the problems resulting from the diffusion of phosphorus. The entire process is designed in consideration of the annealing processes of the ONO oxide film formation and the post oxidation process, in light of upper and lower diffusion, so that the phosphorus density may exceed $3\times10^{19}$ cm$^{-3}$ in any region within the floating gate polysilicon when the element is completed.

According to the method of manufacturing the nonvolatile semiconductor memory of this invention, as mentioned above it is possible not only to prevent damage to the cell gate oxide film due to the impurity in polysilicon, but it is also possible to control the bottom oxide film and minimize the natural oxide film formation before the formation. It is also possible to form the bottom oxide film with an excellent film quality by preventing any impurity from being involved in the grown oxide film, which can result in a great improvement in the reliability of the element.

While there have been illustrated and described what factors are presently considered to be in the preferred embodiments of the present invention, it will be understood by those skilled in the art that various changes and modifications may be made, and equivalents may be substituted for devices thereof without departing from the true scope of the invention. In addition, many modifications may be made to adapt to a particular situation or material regarding the teaching of the present invention without departing from the central scope thereof. Therefore, it is intended that the invention not be limited to the particular embodiment disclosed as the best mode contemplated for carrying out this invention, but that the invention includes all embodiments falling within the scope of the appended claims.

What is claimed is:

1. A method of manufacturing a nonvolatile semiconductor memory, comprising the steps of:
   (a) forming a first oxide film on a semiconductor substrate;
   (b) forming a polysilicon electrode on the first oxide film by sub-steps of forming a first low impurity density polysilicon layer, forming a high impurity density polysilicon layer, and forming a second low impurity density polysilicon layer in the named order; and
   (c) forming a second oxide layer on said polysilicon electrode in contact with the second low impurity density polysilicon layer.

2. The method of manufacturing a nonvolatile semiconductor memory according to claim 1, further comprising the step of:
   (d) forming a second polysilicon electrode above said second oxide layer.

3. The method of manufacturing a nonvolatile semiconductor memory according to claim 1, wherein the polysilicon electrode is formed by a LP-CVD method.

4. The method of manufacturing a nonvolatile semiconductor memory according to claim 1, wherein the impurity of each polysilicon layer of said polysilicon electrode is phosphorus.

5. The method of manufacturing a nonvolatile semiconductor memory according to claim 1, wherein each low impurity density polysilicon layer is a non-doped polysilicon layer.

6. A method of manufacturing a nonvolatile semiconductor memory comprising the steps of:
   (a) forming a first oxide film on a semiconductor substrate;
   (b) forming a polysilicon layer containing a higher impurity content in an inner region, rather than in an upper outer surface region and a lower outer surface region on said first oxide film; and
   (c) forming a second oxide film on the polysilicon layer.

7. The method of manufacturing a nonvolatile semiconductor memory according to claim 6, further comprising the step of:
   (d) forming a second polysilicon layer above the second oxide film.

8. The method of manufacturing a nonvolatile semiconductor memory according to claim 6, wherein the polysilicon layer is formed by a LP-CVD method.

9. The method of manufacturing a nonvolatile semiconductor memory according to claim 6, wherein the impurity is implemented into the high impurity content region of the polysilicon layer by ion implantation.

10. The method of manufacturing a nonvolatile semiconductor memory according to claim 9, wherein the impurity is phosphorus.

11. The method of manufacturing a nonvolatile semiconductor memory according to claim 6, further comprising the step of:
    removing a part of the polysilicon layer selectively followed by the step of forming the second oxide film.

12. A method of manufacturing a nonvolatile semiconductor memory comprising:
    forming a first oxide layer on a semiconductor substrate;
    forming a first polysilicon electrode on said first oxide layer;
    forming a second oxide layer on said first polysilicon electrode; and
    forming a second polysilicon electrode above said second oxide layer,
    wherein said first polysilicon electrode comprises at least three polysilicon layers, a density of impurity of a first layer included in said first polysilicon electrode, contacting said first oxide layer, and a density of impurity of a second layer included in said first polysilicon electrode, contacting said second oxide layer, are lower than that of another layer other than said first and second layers included in said first polysilicon electrode.

13. The method of manufacturing a nonvolatile semiconductor memory according to claim 12, wherein the impurity of each layer of said first polysilicon electrode is phosphorus.

14. The method of manufacturing a nonvolatile semiconductor memory according to claim 12, wherein said first and second layers included in said first polysilicon electrode are non-doped polysilicon layer.

15. A method of manufacturing a nonvolatile semiconductor memory, comprising the steps of:
   (a) forming a gate oxide film on a semiconductor substrate;
   (b) forming a first polysilicon layer as a floating gate having a center region with a higher impurity content than a top region and a bottom region on said gate oxide film;
   (c) forming an oxide film on the first polysilicon layer;
   (d) forming a second polysilicon layer as a control gate above the oxide film.

16. The method of manufacturing a nonvolatile semiconductor memory according to claim 15, wherein the first polysilicon layer is formed by a LP-CVD method.

17. The method of manufacturing a nonvolatile semiconductor memory according to claim 15, wherein the impurity is implemented into the center region of the first polysilicon layer by ion implantation.

18. The method of manufacturing a nonvolatile semiconductor memory according to claim 17, wherein the impurity is phosphorus.

19. The method of manufacturing a nonvolatile semiconductor memory according to claim 15, further comprising the step of:
   diffusing the impurity in the first polysilicon layer by a thermal process to provide a uniform density of the impurity in the first polysilicon layer.

* * * * *